(12) United States Patent
Muro et al.

(10) Patent No.: US 8,058,559 B2
(45) Date of Patent: Nov. 15, 2011

(54) FLEXIBLE PRINTED CIRCUIT BOARD AND ELECTRONIC APPARATUS

(75) Inventors: Kiyomi Muro, Tokyo (JP); Akihiko Happoya, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 819 days.

(21) Appl. No.: 12/114,455

(22) Filed: May 2, 2008

(65) Prior Publication Data

US 2008/0296048 A1 Dec. 4, 2008

(30) Foreign Application Priority Data

Jun. 4, 2007 (JP) .................................. 2007-148569

(51) Int. Cl.
*H05K 1/00* (2006.01)

(52) U.S. Cl. ........ 174/254; 174/255; 174/256; 174/257; 174/261; 361/749; 361/751

(58) Field of Classification Search .................. 174/251, 174/254, 259, 262, 250, 255–257; 361/749–751, 361/748, 739, 757, 771, 796, 799, 800, 816
See application file for complete search history.

(56) References Cited

U.S. PATENT DOCUMENTS

| | | | |
|---|---|---|---|
| 5,296,651 A * | 3/1994 | Gurrie et al. .................. | 174/254 |
| 5,461,202 A | 10/1995 | Sera et al. | |
| 5,479,529 A | 12/1995 | Nakagawa et al. | |
| 6,252,176 B1 * | 6/2001 | Kuramochi et al. .......... | 174/255 |
| 6,664,479 B2 * | 12/2003 | Tanabe et al. .................. | 174/254 |
| 7,164,577 B2 | 1/2007 | Minaguchi et al. | |
| 2005/0111202 A1 * | 5/2005 | Minaguchi et al. .......... | 361/752 |
| 2007/0091581 A1 * | 4/2007 | Gisin et al. .................... | 361/782 |

FOREIGN PATENT DOCUMENTS

| | | |
|---|---|---|
| JP | 02-033999 | 2/1990 |
| JP | 06-120643 | 4/1994 |
| JP | 11-177192 | 7/1999 |
| JP | 2003-069170 | 3/2003 |
| JP | 2005-157790 | 6/2005 |
| JP | 2006-019345 | 1/2006 |

OTHER PUBLICATIONS

The First Office Action issued by Patent Office of the People's Republic of China against the corresponding Chinese patent application No. 2008100933821 on Jun. 26, 2008.

* cited by examiner

*Primary Examiner* — Hoa C Nguyen
(74) *Attorney, Agent, or Firm* — Knobbe, Martens, Olson & Bear, LLP

(57) ABSTRACT

A flexible printed circuit board includes: a base film that has electrical insulation property; a conductive pattern that is formed on the base film and including a pair of differential signal lines and a ground line; an insulating layer that is formed on the conductive pattern; a conductive layer that is formed on the insulating layer; and a connecting portion that electrically connects the ground line and the conductive layer through a penetration hole formed on the insulating layer.

8 Claims, 6 Drawing Sheets

FLEXIBLE PRINTED CIRCUIT BOARD AND ELECTRONIC APPARATUS

CROSS-REFERENCE TO RELATED APPLICATIONS

This application is based upon and claims the benefit of priority from Japanese Patent Application No. 2007-148569, filed on Jun. 4, 2007, the entire content of which are incorporated herein by reference.

BACKGROUND

1. Field

One embodiment of the invention relates to a flexible printed circuit board and an electronic apparatus having the flexible printed circuit board.

2. Description of the Related Art

A personal computer, which is hereinafter simply referred to as a computer, is generally installed with a hard disk drive as a storage device. Recently, especially in a portable notebook computer, there has been increasing a demand for reduction in the weight, size and thickness thereof.

In order to satisfy such demand, there are proposed various notebook computers. An example of such computers is disclosed in JP-A-2005-157790 (counterpart U.S. publications are: U.S. Pat. No. 7,164,577 B2; and US 2005/0111202 A1).

In a notebook computer disclosed in the document JP-A-2005-157790, a hard disk drive and a printed circuit board are connected together by a flexible cable. The flexible cable is connected through the lower portion of the hard disk drive.

However, according to a conventional notebook computer, since a signal for driving a disk drive device is a high frequency signal, there are generated electromagnetic noises, thereby raising a possibility that the electromagnetic noises causes adverse affect on peripheral circuits and peripheral equipment through the hard disk drive. Also, there is a possibility that the electromagnetic noises from the peripheral circuits and equipment cause adverse affect on a signal being transmitted on a flexible cable through the hard disk drive.

SUMMARY

One of objects of the present invention is to provide a flexible printed circuit board and electronic apparatus which are excellent in shielding electromagnetic noises.

According to a first aspect of the present invention, there is provided a flexible printed circuit board including: a base film that has electrical insulation property; a conductive pattern that is formed on the base film and including a pair of differential signal lines and a ground line; an insulating layer that is formed on the conductive pattern; a conductive layer that is formed on the insulating layer; and a connecting portion that electrically connects the ground line and the conductive layer through a penetration hole formed on the insulating layer.

According to a second aspect of the present invention, there is provided a flexible printed circuit board including: a base film that has electrical insulation property; a first adhesive layer formed on the base film; a conductive pattern that is formed on the first adhesive layer and including a pair of differential signal lines and a ground line; a second adhesive layer that is formed on the first adhesive layer and the conductive pattern; an insulating layer that is formed on the second adhesive layer; a conductive layer that is formed on the insulating layer; and a connecting portion that electrically connects the ground line and the conductive layer through a penetration hole formed on the insulating layer and the second adhesive layer.

According to a third aspect of the present invention, there is provided an electronic apparatus including: a disk storage device that stores information on a magnetic disk; a controller that controls the disk storage device; and a flexible printed circuit board that connects the disk storage device and the controller, wherein the flexible printed circuit board includes: a base film that has electrical insulation property; a conductive pattern that is formed on the base film and including a pair of differential signal lines and a ground line; an insulating layer that is formed on the conductive pattern; a conductive layer that is formed on the insulating layer; and a connecting portion that electrically connects the ground line and the conductive layer through a penetration hole formed on the insulating layer.

BRIEF DESCRIPTION OF THE SEVERAL VIEWS OF THE DRAWINGS

A general configuration that implements the various feature of the invention will now be described with reference to the drawings. The drawings and the associated descriptions are provided to illustrate embodiments of the invention and not to limit the scope of the invention.

DETAILED DESCRIPTION

Figure 1:
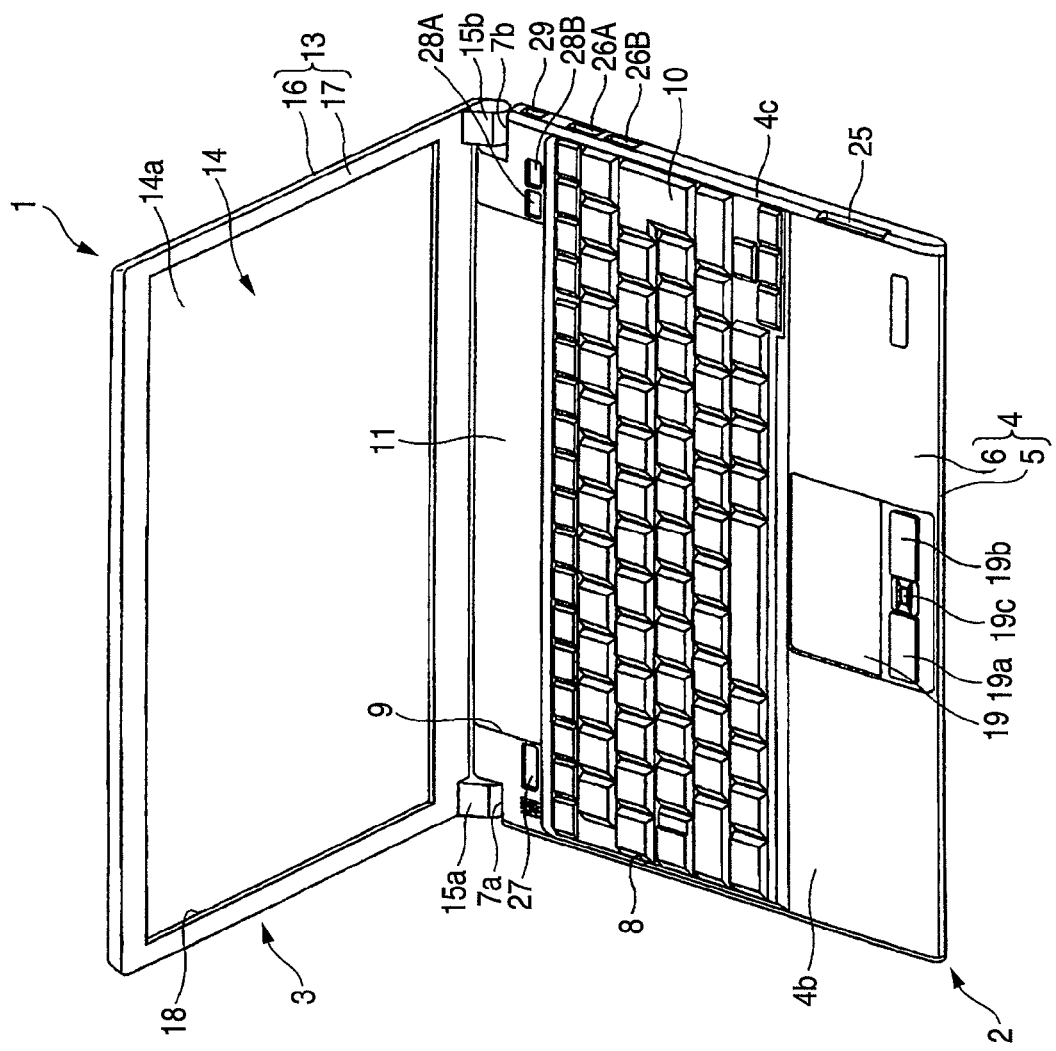
FIG. 1 is a perspective view of a portable computer to which electronic apparatus according to an embodiment of the present invention is applied.

Now, description will be given below of a portable computer with reference to the accompanying drawings. FIG. 1 shows a portable computer 1 as electronic apparatus. The portable computer 1 includes a main unit 2 and a display unit 3.

The main unit 2 includes a first case 4 having a flat box shape which can be placed on a placing surface (not shown) such as the top plate of a desk. The first case 4 is made of metal material such as a magnesium alloy.

The first case 4 includes a base 5 and a top cover 6. The top cover 6 includes an upper wall 4b, a side wall 4c and a rear wall (not shown), while the top cover 6 closes the upper end opening of the base 5.

The first case 4 includes recessed portions 7a and 7b which are respectively formed in the corner portions of the first case 4 defined by the side wall 4c and rear wall. The recessed portions 7a and 7b are situated in the rear end portion of the first case 4 that exists on the display unit 3 side thereof, while the recessed portions 7a and 7b are spaced from each other in the width direction of the first case 4.

The first case 4 includes a keyboard mounting portion 8, a battery storage portion 9 and a touch pad 19. The keyboard mounting portion 8 is a rectangular-shaped recessed portion which opens to the upper surface of the upper wall 4b and supports a keyboard 10. The battery storage portion 9 is situated behind the keyboard 10. The battery storage portion 9 exists in a recessed portion which is opened continuously with the bottom wall, upper wall 4b and rear wall of the first case 4, and supports a battery pack 11 that is removable therefrom. The touch pad 19 is disposed on the upper wall 4b of the top cover 6 such that it is situated on this side of the keyboard 10, while the touch pad 19 includes switches 19a, 19b and a fingerprint read portion 19c.

On the side wall 4c of the first case 4, there are formed a memory card slot 25, a USB (Universal Serial Bus) terminals 26A, 26B and a display terminal 29. Upwardly of the keyboard 10 of the upper wall 4b of the first case 4, there are disposed a power switch 27 and other switches 28A, 28B.

The display unit 3 includes a second case 13 and a liquid crystal display portion 14. The second case 13 has a flat box-like shape substantially equal in size to the first case 4, and includes a pair of leg portions 15a and 15b respectively formed in one end thereof. The leg portions 15a and 15b are spaced from each other in the width direction of the second case 14 and are inserted into the recessed portions 7a and 7b of the first case 4 respectively.

The second case 13 includes an LCD cover (Liquid Crystal Display cover) for supporting the liquid crystal display portion 14 and an LCD mask 17 put on the LCD cover 16. The liquid crystal display portion 14 has a screen 14a for displaying images. The screen 14a is exposed outwardly of the second case 13 through an opening 18 formed in the LCD mask 17.

The top cover 6 of the first case 4 has a pair of hinge supporting portions (not shown). One of the hinge supporting portions is interposed between the left recessed portion 7a and the left end portion of the battery storage portion 9. The other hinge supporting portion is interposed between the right recessed portion 7b and the right end portion of the battery storage portion 9. These hinge supporting portions support the display unit 3 rotatably through metal-made first and second hinge devices (not shown) which are screwed and fixed by screws.

The display unit 3 can be rotated between a closed position and an opened position. At the closed position, the display unit 3 lies on the main unit 2 to cover the keyboard 10 from above. At the opened position, the display unit 3 stands up from the rear end portion of the main unit 2, whereby the keyboard 10 and screen 14a can be exposed respectively.

Figure 2:
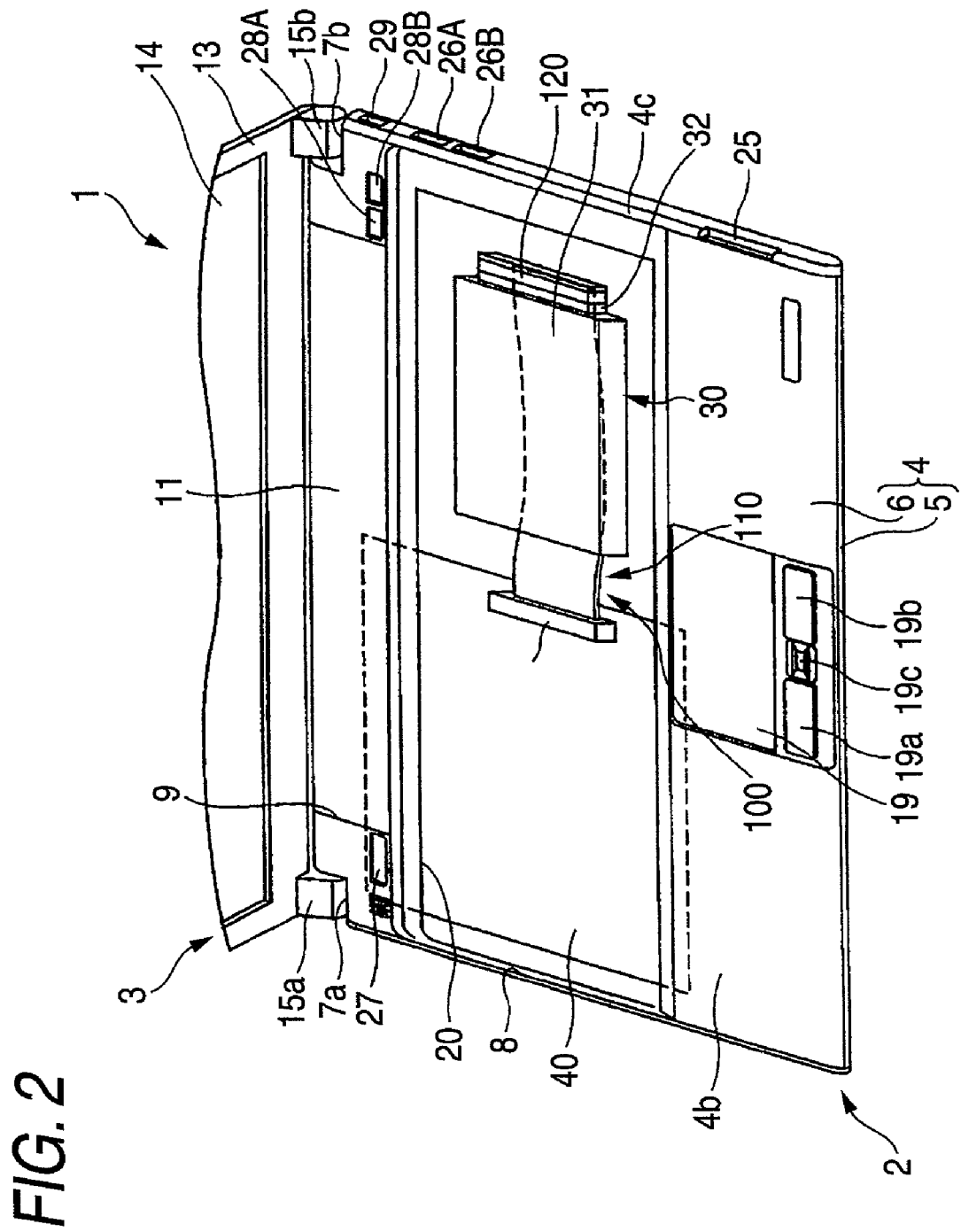
FIG. 2 is a perspective view of a main unit of a flexible printed circuit board with a keyboard removed therefrom.

FIG. 2 is a perspective view of the main unit 2, showing a state thereof in which the keyboard 10 is removed therefrom. The main unit 2 has an opening 20. And, the main unit 2 includes, in this opening 20, a hard disk drive (which is hereinafter referred to as HDD) 30 for driving a hard disk serving as a memory disk, a printed circuit board 40 serving as a control portion for driving the HDD 30, and a flexible printed circuit board 100 for connecting together a female connector 32 provided on the HDD 30 and an edge connector 41 provided on the printed circuit board 40. The flexible printed circuit board 100 is interposed between the printed circuit board 40 and the placing surface of the first case 4. By the way, the memory disk may also be replaced with other disk such as an optical disk.

The printed circuit board 40 is screwed, for example, to the bottom wall of the first case 4.

As the HDD 30, for example, there can be employed an HDD of 1.8 inch, 40 G byte. The HDD 30 includes on the outside thereof a case 31 made of metal or the like, while the female connector 32 is disposed in this case 31. In the female connector 32, there are opened up a pair of guide holes into which a pair of guide pins (which will be discussed later) provided in a male connector 120 of the flexible printed circuit board 100 can be fitted for positioning, and a plurality of pin holes into which a plurality of pins of the male connector 120 can be fitted for electric connection.

Figure 3A:
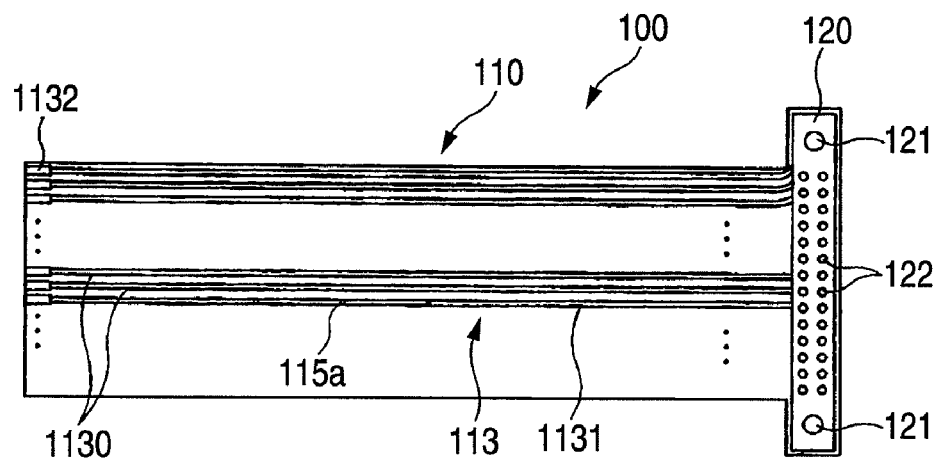
FIG. 3A is a plan view of the flexible printed circuit board shown in FIG. 2.
Figure 3B:
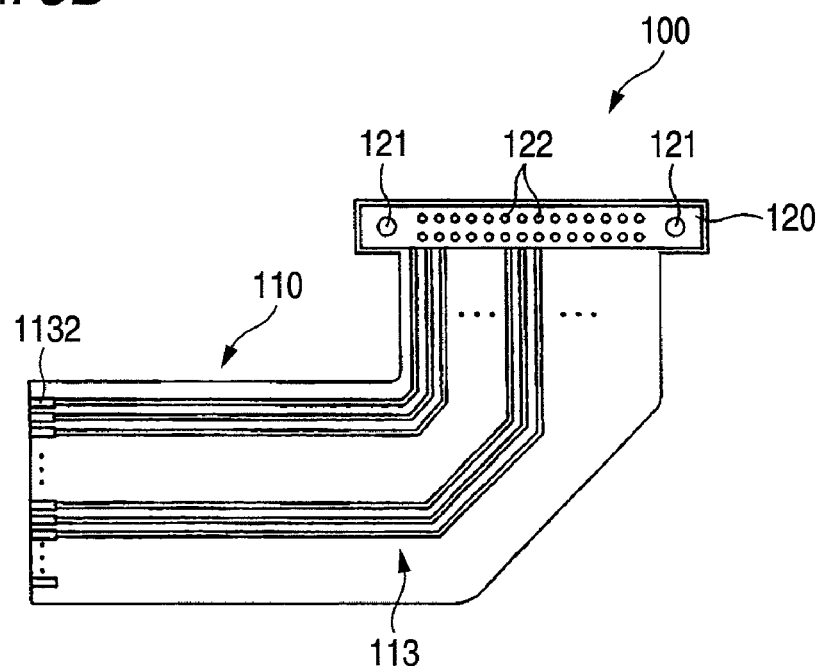
FIG. 3B is a plan view of a modification of the flexible printed circuit board.

FIG. 3A is a plan view of the flexible printed circuit board 100 shown in FIG. 2, and FIG. 3B is a plan view of a modification of the flexible substrate 100. In FIGS. 3A and 3B, in order to facilitate the understanding of the internal structure of the flexible printed circuit board 100, a cover layer (which will be discussed later) and other elements are shown in a transparent manner. The flexible printed circuit board 100 includes a board portion 110 and a male connector 120 provided in the neighboring portion of one end portion of one surface of the board portion 110. The male connector 120 includes a pair of guide pins 121, which are provided on and projected from the two sides of the male connector 120 respectively, and a plurality of pins 122 respectively interposed between the pair of guide pins 121. In the neighboring portion of the other end portion of the board portion 110, there are provided a plurality of terminals 1132 which can be respectively connected to the edge connector 41 of the printed circuit board 40. Also, on the board portion 110, there is provided a conductive pattern 113 including differential signal lines 1130, a ground line 1131, and a control line, a power line and the like.

Figure 4:
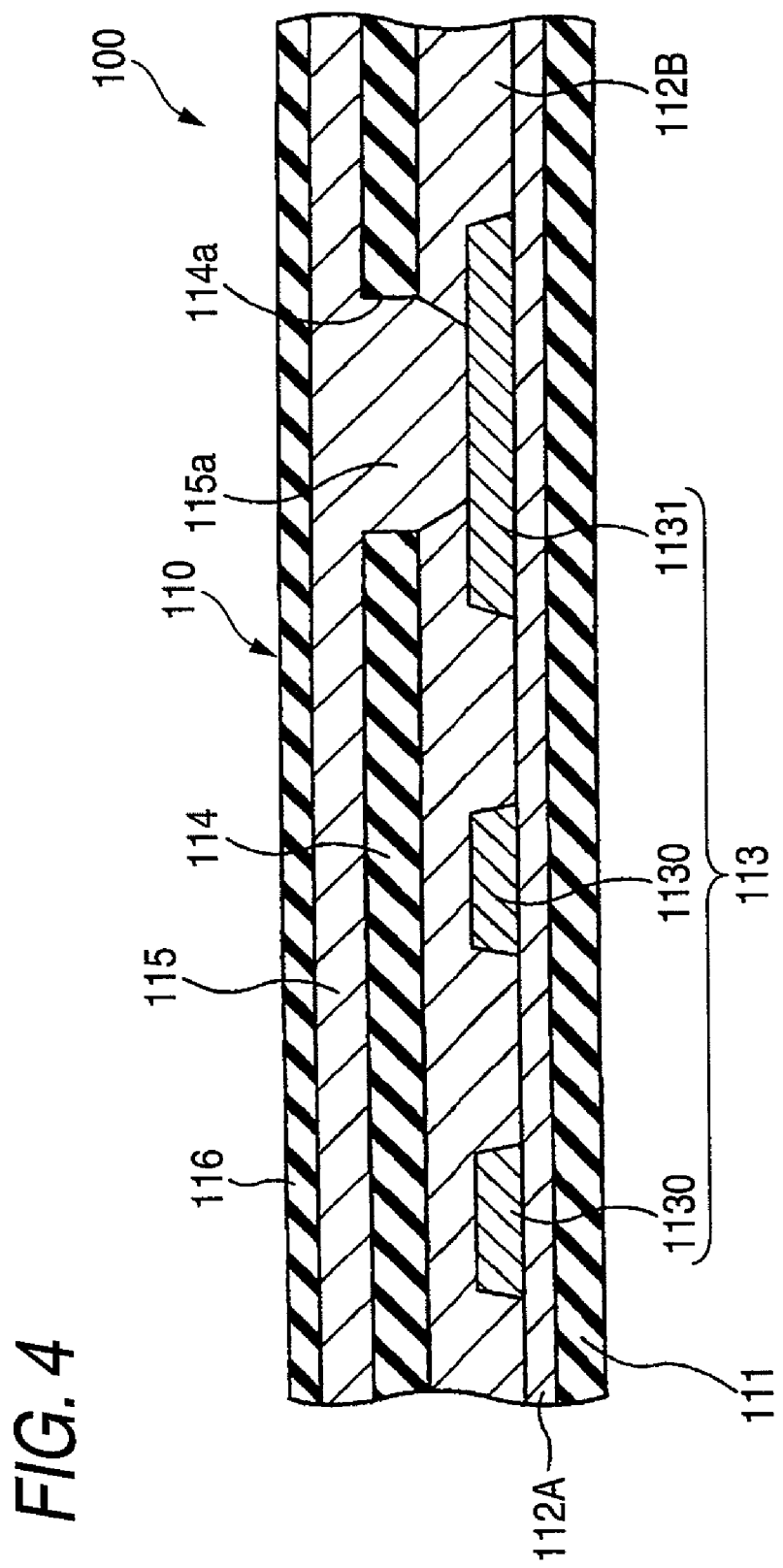
FIG. 4 is a section view of the flexible printed circuit board, showing an example of the layer structure thereof.

FIG. 4 is a section view of an example of the layer structure of the flexible printed circuit board 100. The flexible printed circuit board 100 includes a conductive pattern 113 containing a pair of differential signal lines 1130, a ground line 1131 and the like respectively provided on the base film 111 through an adhesive layer 112A, a cover layer 114 serving as an insulating layer for covering the conductive pattern 113 through an adhesive layer 112B, a conductive paste layer 115 serving as a conductive layer provided on the cover layer 114, and a protect layer 116 for protecting the conductive paste layer 115. In the cover layer 114 and adhesive layer 112B, there is formed a penetration hole, that is, a through hole 114a and a connecting portion 115a which is used to electrically connects together the conductive paste layer 115 and ground line 1131 using conductive paste filled into the through hole 114a.

As the base film 111, there can be used, for example, a polyimide film which has a thickness of 10~100 μm and is excellent in heat resistance and insulating properties.

The conductive pattern 113 is made of copper, gold, a copper alloy, a gold alloy or the like and can be produced, for example, by etching a thin film made of copper foil or the like.

As the cover layer 114, there can be used, for example, a polyimide film which has a thickness of 10~100 μm and is excellent in heat resistance and insulating properties.

The adhesive layer 112A to be applied onto the base film 111 and the adhesive layer 112B for connecting the cover layer 114 may be made of, for example, epoxy system adhesive.

The conductive paste layer 115 can be produced by dispersing conductive particles such as silver particles in binder resin, and the conductive paste layer 115 has excellent shielding properties against electromagnetic wave noises. As such conductive paste layer 115, there can be used, for example, a silver paste, a silver/carbon mixed paste, a gold paste, a silver/palladium paste, a silver/platinum paste, a palladium paste, a platinum paste, a Ni paste, a copper paste, or the like. According to the present embodiment, there is used a silver/carbon mixed paste. As the binder resin, there can be used, for example, polyester resin, epoxy resin, polyimide resin, or the like.

The protect layer 116 is made of polyester resin, epoxy resin, melamine resin, or other types of resin.

The sizes and material of the respective composing elements of the flexible printed circuit board 100 are not limited to the above-mentioned ones.

FIGS. 5A-5E are section views of the flexible printed circuit board 100, showing an example of a process for manufacturing the flexible printed circuit board 100.

Figure 5B:
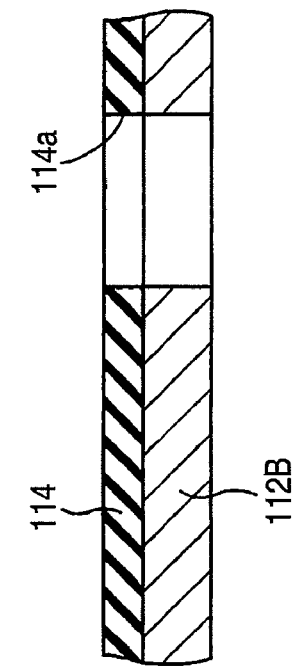
FIGS. 5A-5E are respectively section views of an example of a process for manufacturing the flexible printed circuit board.
Figure 5A:
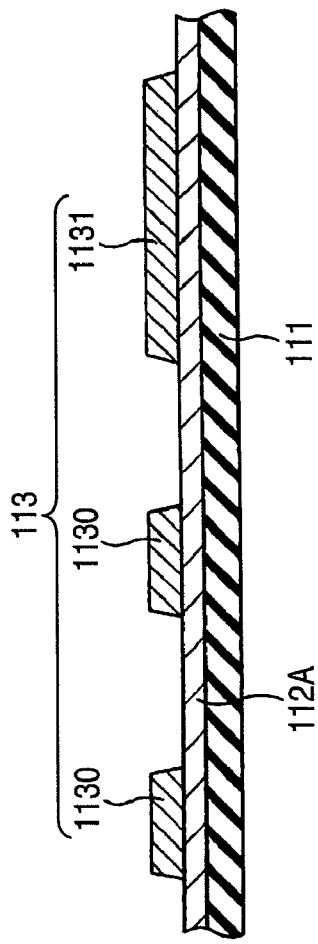

The adhesive layer 112A is applied onto the base film 111, the material of the conductive pattern 113, for example, a copper foil is adhered to the adhesive layer 112A and, as shown in FIG. 5A, the copper foil is etched to thereby produce the conductive pattern 113.

On the other hand, as shown in FIG. 5B, the adhesive layer 112B is applied onto the lower surface of the cover layer 114 and, using a laser or the like, there is formed the through hole 114a.

Figure 5C:
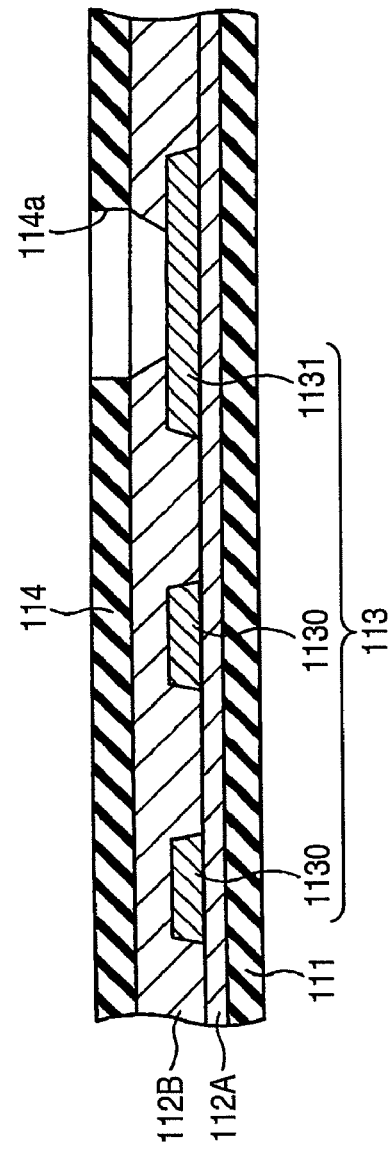

Next, as shown in FIG. 5C, the adhesive layer 112A of the base film 111 shown in FIG. 5A and the adhesive layer 112B of the cover layer 114 shown in FIG. 5B are laminated to is each other. After then, the two adhesive layers 112A and 112B are pressed for one hour at a temperature of 160~200° C. with a pressing force of 15~30 kg/cm² using a heat press, thereby uniting them together.

Figure 5D:
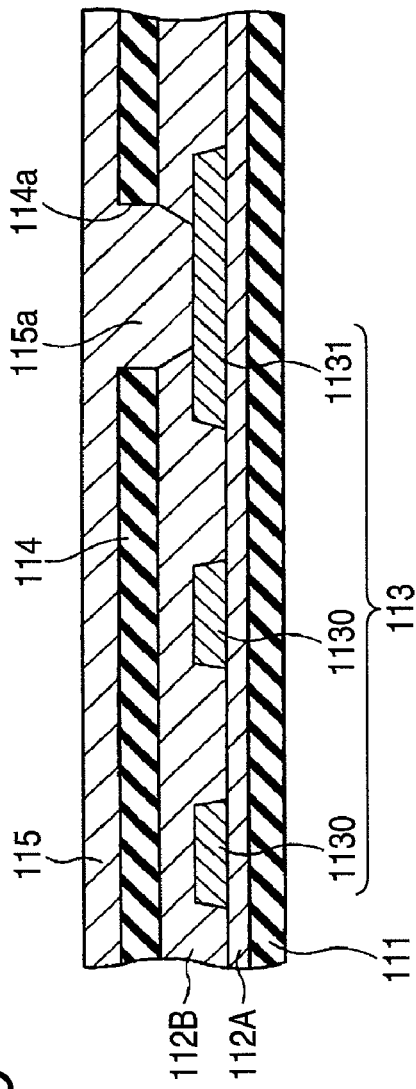

Next, as shown in FIG. 5D, conductive paste is applied onto the cover layer 114, and this conductive paste is heated for 10~30 minutes at a temperature of 150° C. and is thereby hardened, whereby the connecting portion 115a and conductive paste layer 115 are produced.

Figure 5E:
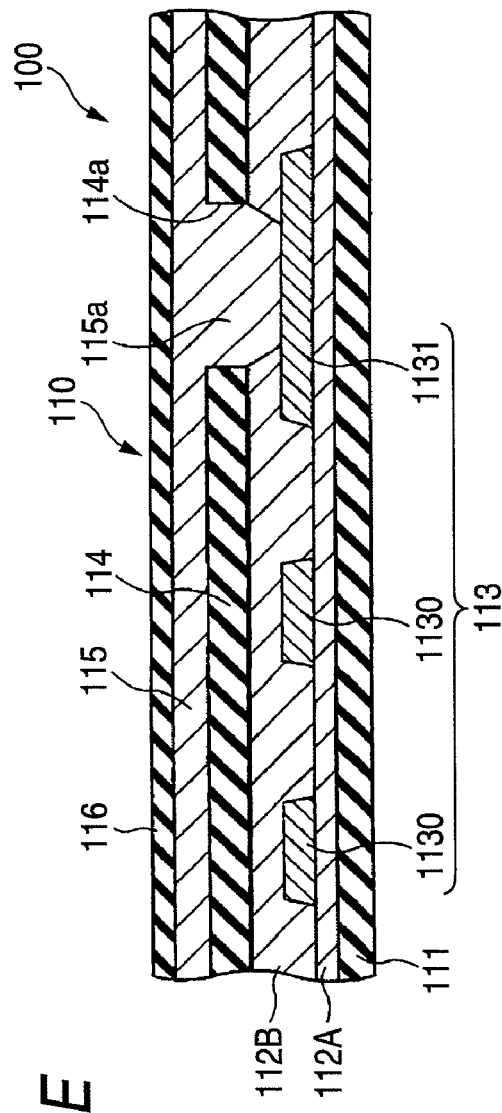

Next, as shown in FIG. 5E, the protect layer 116 is formed on the upper surface and side surface of the conductive paste layer 115 by screen printing and is heated for 10~30 minutes at a temperature of 130~150° C. to thereby harden the protect layer 116. Then, the male connector 120 is connected to the one end portion side of the thus produced the board portion 110 to thereby produce the flexible printed circuit board 100.

Next, description will be given below of the operation of the portable computer 100. For example, when driving the hard disk drive 30, from the printed circuit board 40, there are transmitted, as drive signals, for example, a pair of differential signals each of 1 kHz or higher to the hard disk drive 30 through a pair of differential signal lines 1130 of the flexible printed circuit board 100. Based on the differential signals transmitted thereto from the printed circuit board 40, the hard disk drive 40 drives a magnetic head and accesses a platter.

When the flexible printed circuit board 100 transmits the differential signal, the differential signal line 1130 generates electromagnetic noises; however, since the electromagnetic noises are shielded by the conductive paste layer 115 and also by the hard disk drive 30, radiation of the electromagnetic noises to the outside can be prevented. Also, even when the noises happen to ride the differential signal, the noises can be corrected to such a degree that the influence of the noises can be neglected.

That is, a differential signal system is a system which converts a signal into two signals, that is, one signal having a forward phase and the other having a backward phase, and sends these two signals into two transmission passages (here, the two differential signal lines 1130) respectively. Thus, even when noises mix into the two transmission passages respectively, the noises ride the signals of the respective phases while the noises are in phase. When the signals being transmitted under the influence of the noises arrive at the receiver side, on the receiver side, the respective signals are differentiated to allow the noises in phase to cancel each other, thereby generating a signal which has been corrected to such a degree that the influence of the noises can be neglected.

Also, after the hard disk drive 30 reads data from a hard disk, it transmits the data to the printed circuit board 40 through the signal lines of the flexible printed circuit board 100. In this case, even when electromagnetic noises are radiated from the outside, the electromagnetic noises are shielded by the hard disk drive 30 and conductive paste layer 115, thereby being able to prevent the noises from mixing into the data being transmitted.

According to the present embodiment, the flexible printed circuit board 100 is structured such that the differential signal lines 1130 are covered with the conductive paste layers 115; and, therefore, the flexible printed circuit board 100 is excellent in shielding the electromagnetic noises. Also, even when the electromagnetic noises happen to ride the differential signals, the signals are allowed to cancel each other to such a degree that the influence of the electromagnetic noises can be ignored, whereby the flexible printed circuit board 100 can carry out a driving operation with high reliability. Also, since the flexible printed circuit board 100 is structured such that a conductive pattern is formed on one surface of the base film 111, the flexible printed circuit board 100 is small in thickness and excellent in flexibility.

The present invention is not limited to the above-mentioned embodiment but can be enforced in various modified manners. For example, as the application fields of the invention, the invention not only can be used to connect together the memory disk such as the above-mentioned HDD or optical disk and the printed circuit board but also can be used for connecting of serial transfer lines employed in USB, PCI Express and the like.

What is claimed is:

1. An electronic device comprising:
a case; and
a flexible printed circuit board disposed in the case, the flexible printed circuit board comprising:
a base film comprising an electrical insulating property;
a conductive pattern made of a first metal material including a copper component, the conductive pattern being disposed on the base film wherein the conductive pattern comprises a pair of differential signal lines and a ground line;
an insulating layer formed on the conductive pattern;
a conductive layer formed on the insulating layer, wherein the conductive layer is made of a second metal material that includes a silver paste; and
an electrical connector between the ground line and the conductive layer through a penetration hole formed in the insulating layer, wherein the electrical connector is made of the second metal material.

2. The electronic device of claim 1, wherein the conductive layer and the electrical connector are made of conductive silver paste.

3. The electronic device of claim 1, wherein the conductive pattern is formed by etching a copper film.

4. The electronic device of claim 1, wherein the second metal material comprises a binder resin and conductive particles dispersed in the binder resin, and
wherein the conductive layer and the electrical connector are configured to shield against electromagnetic noises.

5. An electronic device comprising:
a case; and
a flexible printed circuit board disposed in the case, the flexible printed circuit board comprising:
a base film comprising an electrical insulating property;
a conductive pattern disposed on the base film, wherein the conductive pattern comprises a pair of differential signal lines and a ground line, and wherein the conductive pattern is made of a first metal material;

an insulating layer disposed on the conductive pattern;

a conductive layer formed on the insulating layer, wherein the conductive layer is made of a second metal material; and an electrical connector between the ground line and the conductive layer through a penetration hole formed in the insulating layer, wherein the electrical connector is made of the second metal material.

6. The electronic device of claim 5, wherein the conductive layer and the electrical connector are formed of conductive silver paste.

7. The electronic device of claim 5, wherein the conductive pattern is formed by etching a copper film.

8. The electronic device of claim 5, wherein the second metal material comprises a binder resin and conductive particles dispersed in the binder resin, and wherein the conductive layer and the electrical connector are configured to shield against electromagnetic noises.

* * * * *